US008286816B2

(12) United States Patent
Cheng et al.

(10) Patent No.: US 8,286,816 B2
(45) Date of Patent: Oct. 16, 2012

(54) CASING FOR OUTDOOR COMMUNICATION APPARATUS AND PROTECTIVE DEVICE FOR THE SAME

(75) Inventors: Yung-Chi Cheng, Bade (TW); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 306 days.

(21) Appl. No.: 12/703,411

(22) Filed: Feb. 10, 2010

(65) Prior Publication Data
US 2011/0147247 A1 Jun. 23, 2011

(30) Foreign Application Priority Data

Dec. 17, 2009 (TW) ................................ 98143431 A (51) Int. Cl.
*B65D 6/28* (2006.01)
(52) U.S. Cl. ...................................... 220/4.02; 220/694
(58) Field of Classification Search .................. 206/320; 220/3.3, 3.8, 4.02, 23.91, 639, 646, 694, 220/727
See application file for complete search history.

(56) References Cited

U.S. PATENT DOCUMENTS

| | | | | |
|---|---|---|---|---|
| 5,759,644 A * | 6/1998 | Stanley | ......................... | 206/320 |
| 6,462,958 B2 * | 10/2002 | Ogata | .......................... | 220/4.02 |
| 6,826,859 B1 * | 12/2004 | Lin | .................................. | 40/514 |
| 6,948,826 B2 * | 9/2005 | Fogerlie | ........................ | 362/183 |
| 8,013,242 B1 * | 9/2011 | Thibault et al. | ................ | 220/3.3 |
| 2001/0036735 A1 * | 11/2001 | Rhoades | ....................... | 438/690 |
| 2006/0201833 A1 * | 9/2006 | Chen | ............................ | 206/349 |
| 2008/0251512 A1 * | 10/2008 | Griffin et al. | ................ | 220/4.02 |
| 2010/0270190 A1 * | 10/2010 | Howard | ........................ | 206/320 |

* cited by examiner

*Primary Examiner* — Luan K Bui
(74) *Attorney, Agent, or Firm* — Schmeiser, Olsen & Watts, LLP (57) ABSTRACT

A protective device is applicable to a casing provided with a first coupling portion and configured for use with an outdoor communication apparatus. The protective device includes a body and a shielding portion. The body is configured to shield the front of the casing and provided with a second coupling portion coupled to the first coupling portion. The shielding portion is laterally provided to the side of the body for shielding the casing sideways. Hence, the shielding portion of the protective device shields the casing from direct irradiation of sunlight, prevents the outdoor communication apparatus from being overheated, and protects the outdoor communication apparatus against rainwater and dirt. A casing configured for use with an outdoor communication apparatus and equipped with the protective device is further provided.

20 Claims, 11 Drawing Sheets

CASING FOR OUTDOOR COMMUNICATION APPARATUS AND PROTECTIVE DEVICE FOR THE SAME

CROSS-REFERENCE TO RELATED APPLICATIONS

This non-provisional application claims priority under 35 U.S.C. §119(a) on Patent Application No(s). 098143431 filed in Taiwan, R.O.C. on 17 Dec. 2009, the entire contents of which are hereby incorporated by reference.

FIELD OF THE INVENTION

The present invention relates to casings and protective devices for the same, and more particularly, to casings for an outdoor communication apparatus and protective devices for use with the casings in which environmental influence on the operation of the communication apparatus can be minimized.

BACKGROUND OF THE INVENTION

Figure 1:
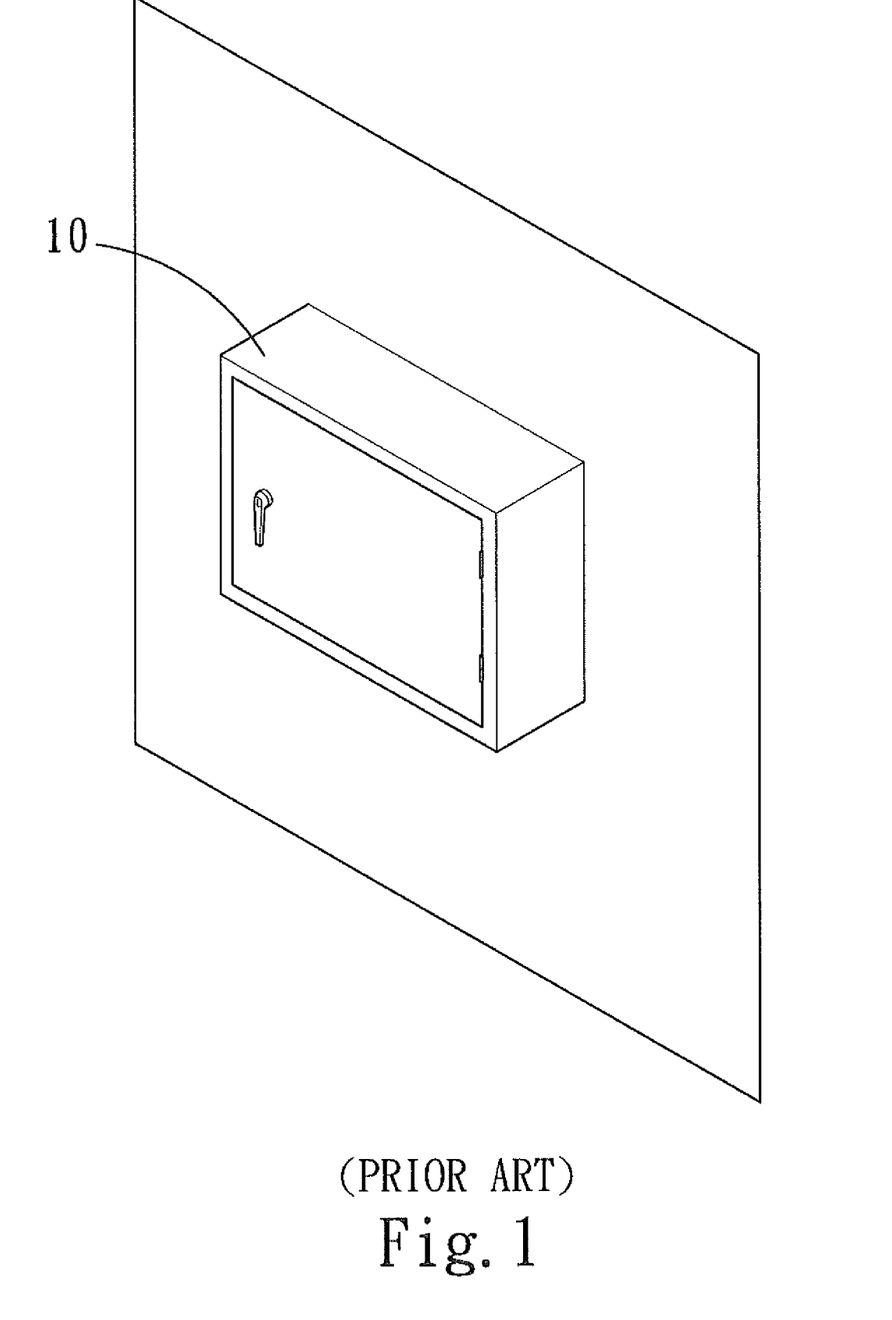
FIG. 1 is a schematic view of a conventional casing for a communication apparatus.

FIG. 1 shows a schematic view of a conventional casing 10 for a communication apparatus. The casing 10 is provided therein with a high-speed communication apparatus. Because the casing 10 is installed outdoors and exposed to direct sunshine and rain, dust and rainwater readily invade into the casing 10 to affect the normal operation of the communication apparatus in the casing 10.

In general, operation of communication apparatuses can involve high-speed transmission and exchange of signals, during which the communication apparatuses are vulnerable to high temperature, because high temperature deteriorates signal reception and retrieval to the detriment of the performance of the communication apparatuses. In this regard, a conventional casing is usually installed outdoors and thereby directly exposed to sunshine and eventually overheated, thus resulting in deteriorated efficiency of signal transmission.

SUMMARY OF THE INVENTION

It is an objective of the present invention to provide a casing for an outdoor communication apparatus and a protective device for use with the casing, so as to overcome a drawback of the prior art, that is, a conventional communication apparatus is readily overheated under sunshine.

Another objective of the present invention is to provide a casing for an outdoor communication apparatus and a protective device for use with the casing for advertising purposes.

To achieve the above and other objectives, the present invention provides a protective device applicable to a casing provided thereon with a first coupling portion and configured for use with an outdoor communication apparatus, the protective device comprising: a body configured to shield a front of the casing and provided with a second coupling portion coupled to the first coupling portion; and a shielding portion laterally provided to a side of the body and configured to shield the casing sideways.

To achieve the above and other objective, the present invention provides a casing for an outdoor communication apparatus. The casing comprises: a case; a cover hingedly coupled to the case and provided thereon with a first coupling portion; and a protective device comprising a body for shielding a front of the cover and a shielding portion laterally provided to a side of the body and configured to shield the cover and the case sideways, the body comprising a second coupling portion coupled to the first coupling portion.

In an embodiment, the shielding portion comprises: a first shielding plate extending from top of the body and bending and extending toward an inside of the body; and a second shielding plate extending from a side of the body and bending and extending toward the inside of the body. The shielding portion further comprises a third shielding plate extending from a side of the body opposite to the second shielding plate and bending and extending toward the inside of the body.

In an embodiment, in the protective device of the present invention, a portion of the second shielding plate and a portion of the third shielding plate extend to two sides of the first shielding plate, respectively. The body and the shielding portion of the protective device are integrally formed as a unitary structure and made of aluminum or aluminum alloy.

In an embodiment, the body is provide thereon with a mark structure. The mark structure is one of a sticker, a laser-engraved pattern, and a print.

In an embodiment, the protective device further comprises a solar panel coupled to an outer surface of the body.

In an embodiment, the first coupling portion of the present invention comprises a plurality of posts provided on the surface of the casing and provided with screw holes, and the second coupling portion comprises apertures corresponding in quantity and position to the posts and penetratable by screws for engagement. Alternatively, the second coupling portion comprises a plurality of posts provided on the inner surface of the body and provided with screw holes, and the first coupling portion comprises apertures corresponding in quantity and position to the posts and penetratable by screws for engagement.

In an embodiment, the first coupling portion of the present invention comprises a plurality of posts provided on the surface of the casing and provided with tenons, and the second coupling portion comprises mortises corresponding in quantity and position to the posts and insertable by the tenons for engagement. Alternatively, the second coupling portion comprises a plurality of posts provided on the inner surface of the body and provided with tenons, and the first coupling portion comprises mortises corresponding in quantity and position to the tenons and insertable by the tenons for engagement.

A protective device of the present invention is effective in shielding a casing for an outdoor communication apparatus from direct irradiation of sunlight. A shielding portion laterally provided to the side of a body of the protective device shields the casing sideways. Hence, the protective device is effective in protecting the casing against sideward irradiation of sunlight and invasion of dust, rainwater, and dirt. In addition, a solar panel installed on the protective device supplies electric power to the outdoor communication apparatus to thereby reduce the power costs of the outdoor communication apparatus. Hence, the casing configured for use with an outdoor communication apparatus and equipped with the protective device according to the present invention ensures relatively stable operation and better performance than a conventional casing disclosed in the prior art.

DETAILED DESCRIPTION OF THE EMBODIMENTS

The objectives, features and advantages of the present invention are described in detail hereunder to enable persons skilled in the art to gain insight into the present invention with reference made to the embodiments described hereunder and the accompanying drawings.

Figure 2:
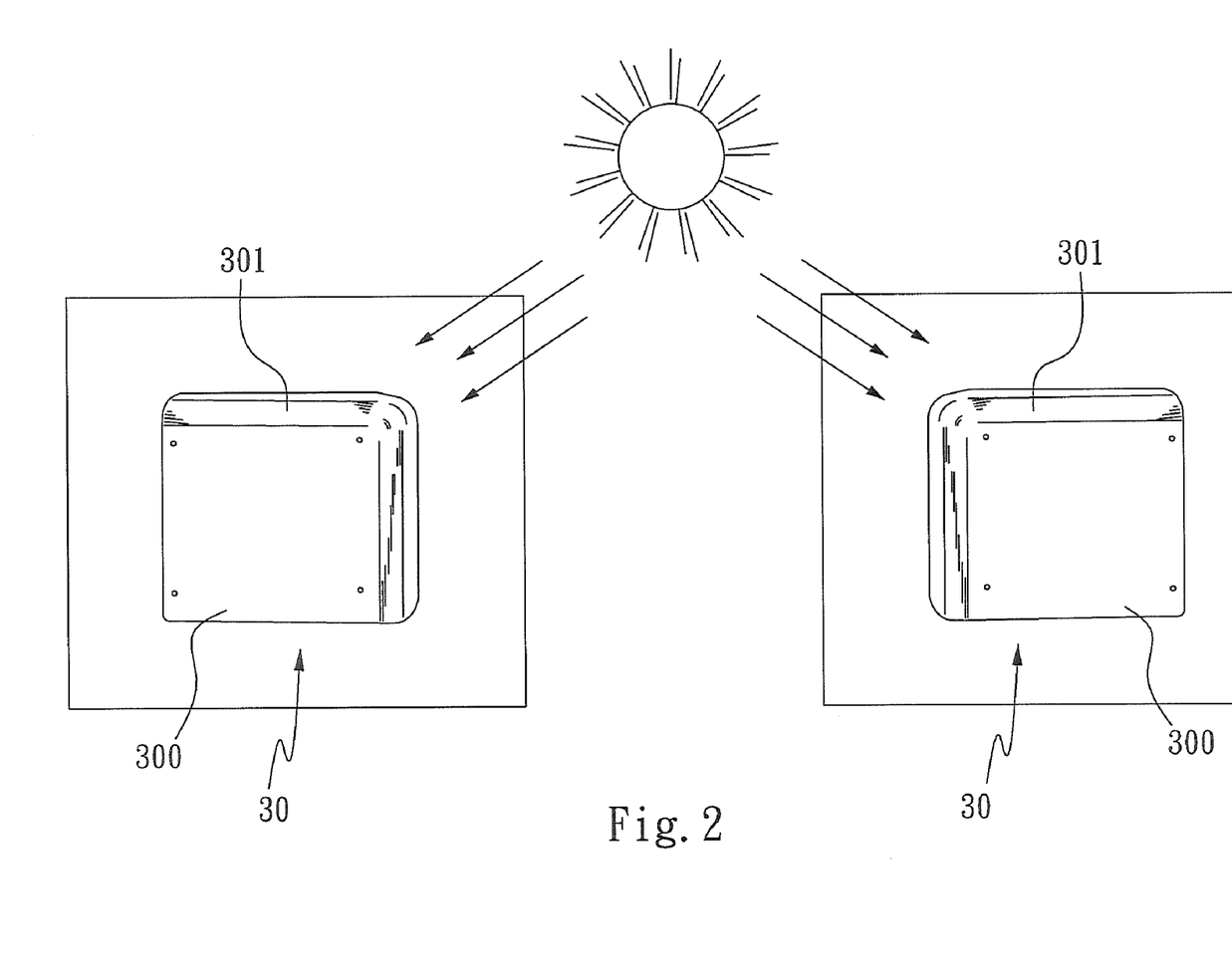
FIG. 2 is a schematic view of a protective device and a casing for use with an outdoor communication apparatus in an embodiment according to the present invention.

FIG. 2 shows a schematic view of a protective device and a casing for use with an outdoor communication apparatus in an embodiment according to the present invention. As shown in the drawing, the protective device 30 comprises a body 300 and a shielding portion 301. The shielding portion 301 is laterally provided to the side of the body 300 for shielding the casing sideways. The body 300 shields the front of the casing. The casing of the outdoor communication apparatus is covered by the protective device 30 and hence not shown in FIG. 2. The extension direction of the shielding portion 301 of the present invention is adjustable as needed. As shown in FIG. 2, the position of the shielding portion 301 is subject to changes, depending on the angle of incidence of sunlight. In the embodiment illustrated in FIG. 2, the shielding portion 301 is provided on two sides of the body 300. However, persons skilled in the art understand that the position and quantity of the shielding portion 301 are subject to changes as needed and are not limited to what disclosed in FIG. 2. Also, the body 300 and the shielding portion 301 can be integrally formed as a unitary structure and made of aluminum or aluminum alloy.

Figure 3A:
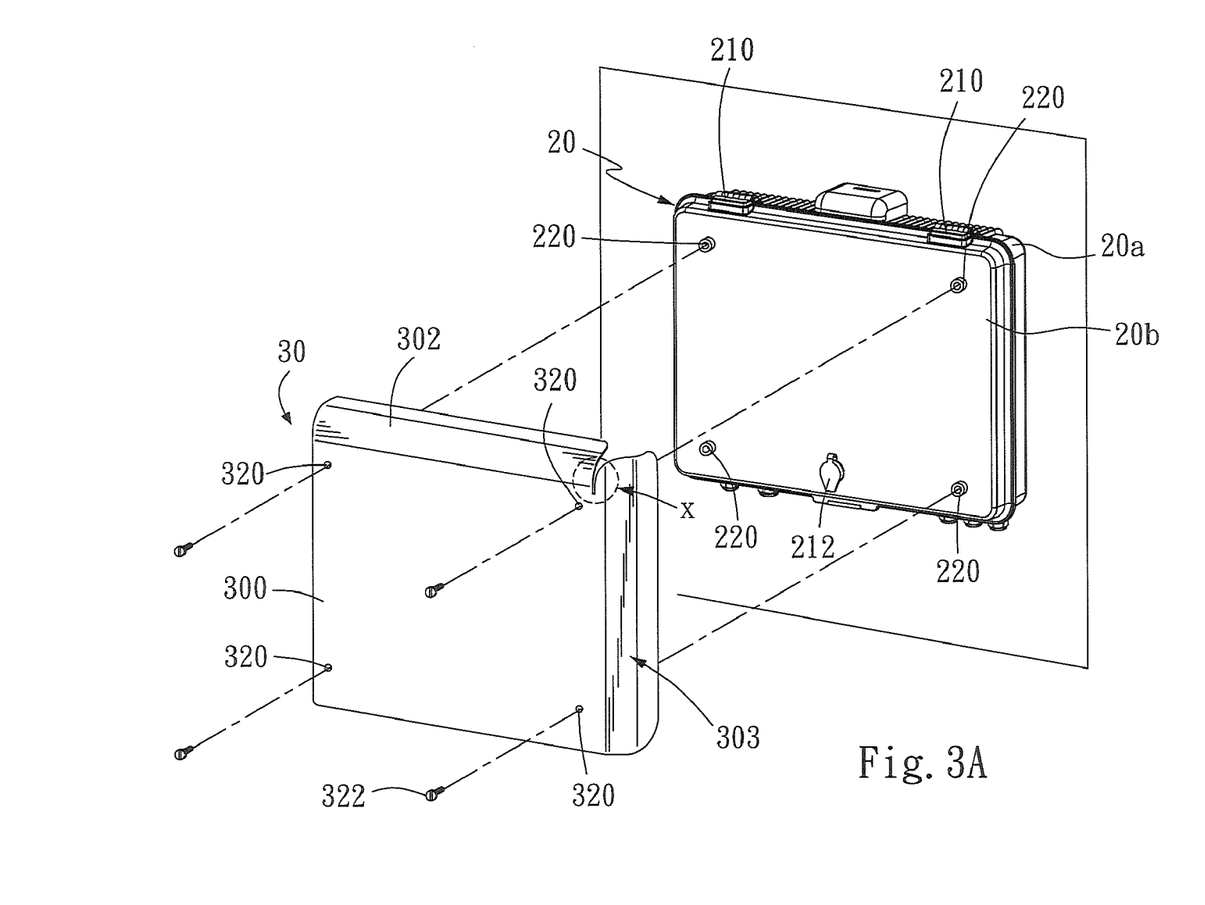
FIG. 3A is aschematic view of a protective device and a casing separated therefrom for use with an outdoor communication apparatus in another embodiment according to the present invention.
Figure 4:
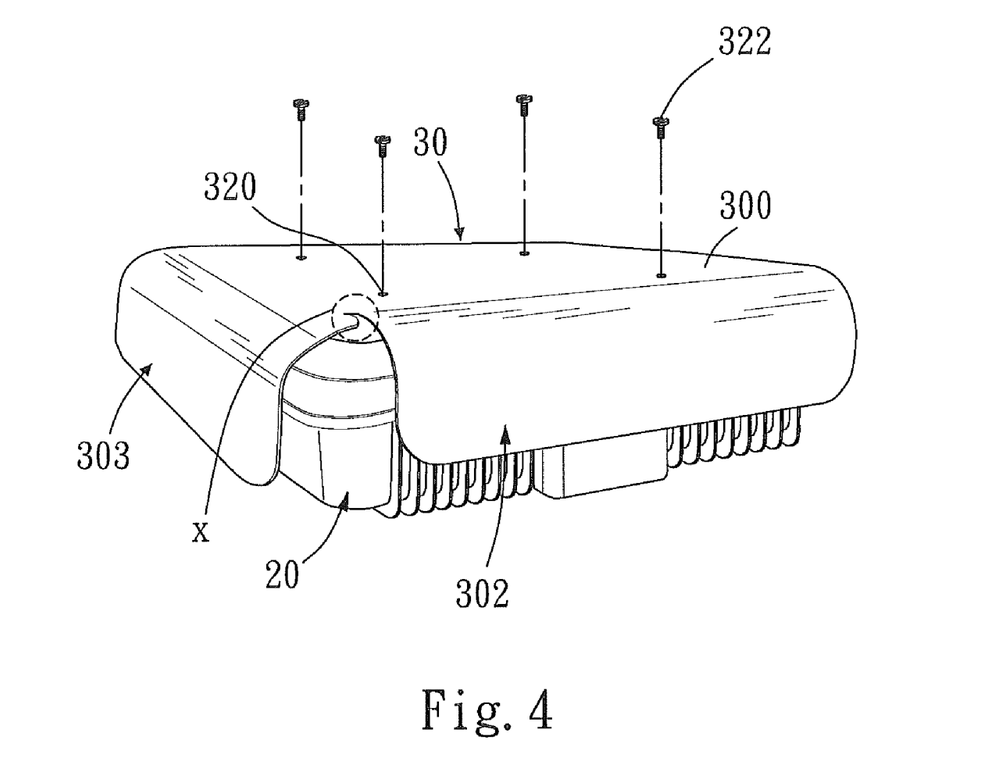
FIG. 4 is a schematic view of a protective device and a casing combined therewith for use with an outdoor communication apparatus in another embodiment according to the present invention.

FIG. 3A is a schematic view of a protective device and a casing separated therefrom for use with an outdoor communication apparatus in another embodiment according to the present invention. FIG. 4 is a schematic view of a protective device and a casing combined therewith for use with an outdoor communication apparatus in another embodiment according to the present invention. Referring to FIG. 3A and FIG. 4, in this embodiment, the shielding portion 301 (see FIG. 2) comprises a first shielding plate 302 and a second shielding plate 303. Referring to FIG. 3A, the protective device 30 comprises the body 300, the first shielding plate 302, and the second shielding plate 303. The body 300 is provided with at least a second coupling portion 320 corresponding in position to and coupled to a first coupling portion 220 provided on the casing 20. This embodiment is exemplified by four said second coupling portions 320 and four said first coupling portions 220 corresponding in position thereto, but the quantity of the second coupling portions 320 and the first coupling portions 220 is subject to changes as needed rather than being restrictive of the present invention. Referring to FIG. 3A, the casing 20 can comprise a case 20a and a cover 20b. The cover 20b is hingedly coupled to the case 20a. The cover 20b is provided thereon with the first coupling portions 220 coupled to the second coupling portions 320 provided on the body 300. The body 300 shields the front of the cover 20b, and the shielding portion (the first shielding plate 302 and the second shielding plate 303 in this embodiment) shields the case 20a and the cover 20b sideways.

Figure 3B:
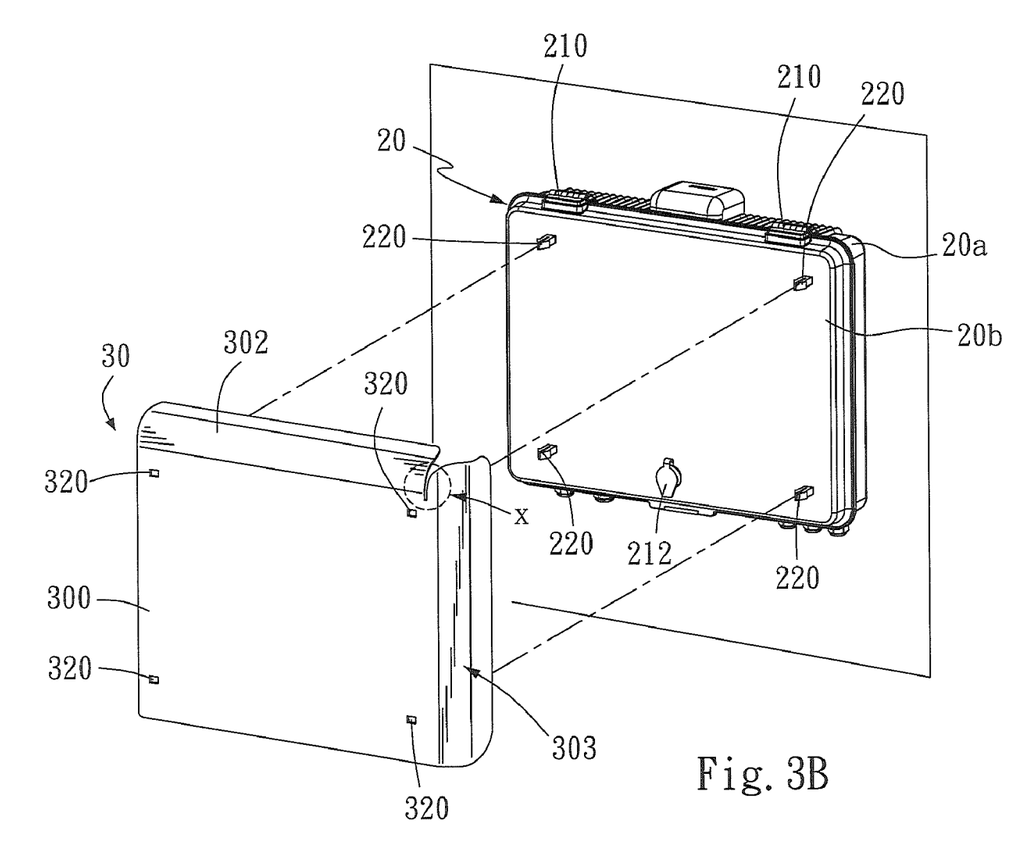
FIG. 3B is a schematic view of a protective device and a casing separated therefrom for use with an outdoor communication apparatus in another embodiment according to the present invention.

The second coupling portions 320 and the first coupling portions 220 are locked to or engaged with each other or are coupled to each other by any other means such that the protective device 30 is fixed to the casing 20. For instance, the first coupling portions 220 are a plurality of posts provided on the surface of the casing 20 and provided with screw holes, and the second coupling portions 320 are apertures corresponding in quantity and position to the posts and penetratable by screws for engagement, as shown in FIG. 3A. Alternatively, the second coupling portions 320 are a plurality of posts provided on the inner surface of the body 300 and provided with screw holes, and the first coupling portions 220 are apertures corresponding in quantity and position to the posts and penetratable by screws for engagement. In another embodiment, the first coupling portions 220 are a plurality of posts provided on the surface of the casing 20 and provided with tenons, and the second coupling portions 320 are mortises corresponding in quantity and position to the posts and insertable by the tenons for engagement, as shown in FIG. 3B. Alternatively, the second coupling portions 320 are a plurality of posts provided on the inner surface of the body 300 and provided with tenons, and the first coupling portions 220 are mortises corresponding in quantity and position to the tenons and insertable by the tenons for engagement.

In this embodiment, the second coupling portions 320 of the protective device 30 are fastened with the casing 20 by a plurality of fastening elements 322. The fastening elements 322 are screws, bolts, or any other equivalent fastening elements. The protective device 30 is made of aluminum, aluminum alloy, or any other equivalent material. The casing 20 is disposed inside the protective device 30 so as to provide good heat dissipation and to shield the casing 20 from sunlight efficiently. The protective device 30 is a thin board, a hollow-cored board, or any equivalent structure. Where the protective device 30 is a thin board, the thickness of the protective device 30 is subject to changes as needed. For example, the further the first shielding plate 302 and the second shielding plate 303 extend, the thicker should be the protective device 30 so as to maintain the rigidity of the thin board. For instance, a thin board of 0.8 mm in thickness is bent to form the protective device 30.

The first shielding plate 302 extends from top of the body 300 and bends and extends toward the inside of the body 300. The bend thus made has a large curvature so as to be dustproof and prevent accumulation of water droplets. The length of extension depends on the dimensions of the casing 20, so as not to expose the casing 20 to direct sunshine, rainwater, and dust.

The second shielding plate 303 extends from one side of the body 300 and bends and extends toward the inside of the body 300. As shown in FIG. 3A, the bend thus made has a large curvature so as to be dustproof and prevent accumulation of water droplets.

To augment protection, a portion of the second shielding plate 303 extends to one side of the first shielding plate 302. At position x shown in FIG. 4, the second shielding plate 303 further extends to one side of the first shielding plate 302 such that the extended portion of the second shielding plate 303 shields the casing 20 from lateral irradiation of sunlight and invasion of dust and rainwater to a greater extent.

Referring to FIG. 3A, the casing 20 is provided thereon with a plurality of said first coupling portions 220, and the casing 20 can be opened, shut, and locked by means of hinges 210 and a locking element 212. Given coordinated engagement of the first coupling portions 220 and the second coupling portions 320, a gap (at position x shown in FIG. 4) is created between the protective device 30 and the casing 20 for maintaining ventilation of air and enhancing dissipation of heat.

Figure 5:
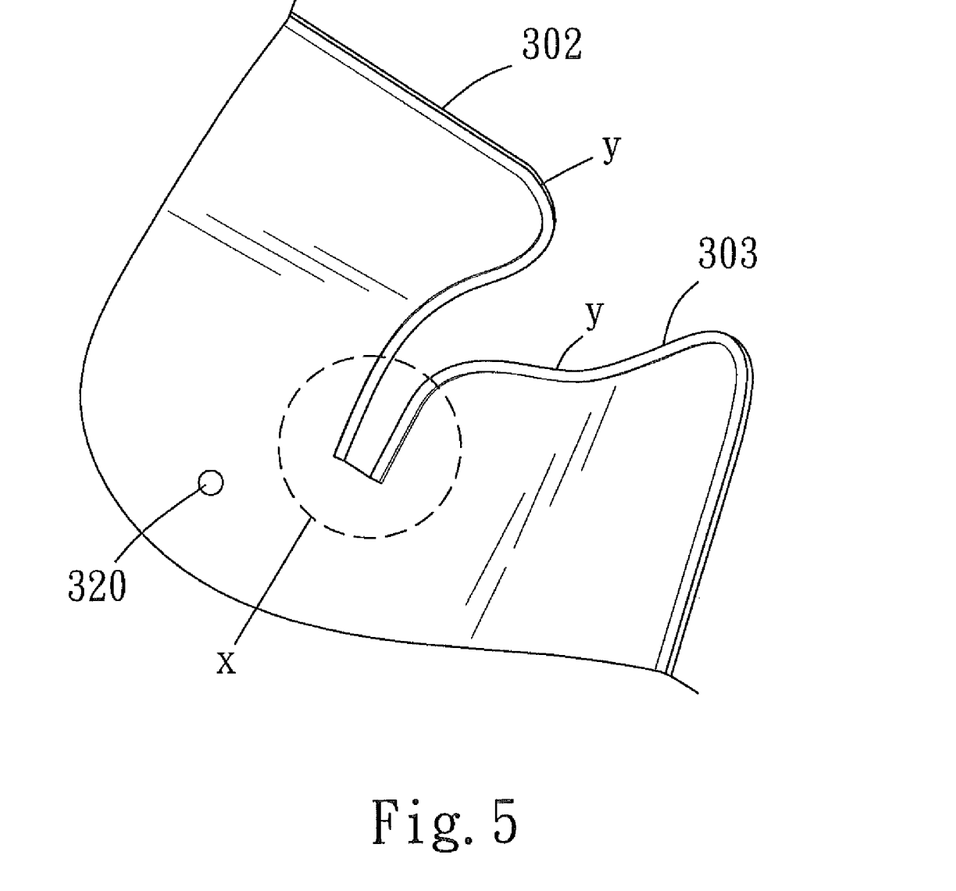
FIG. 5 is a schematic view of a turnup portion of a protective device in an embodiment according to the present invention.

Referring to FIG. 5, there is shown a schematic view of a turnup portion of a protective device in an embodiment according to the present invention. The first shielding plate 302 and the second shielding plate 303 of the protective device of the present invention have a turnup portion (position y) at the adjoining edges thereof, so as to ensure the work safety of workers assembling/disassembling the protective device.

Figure 6:
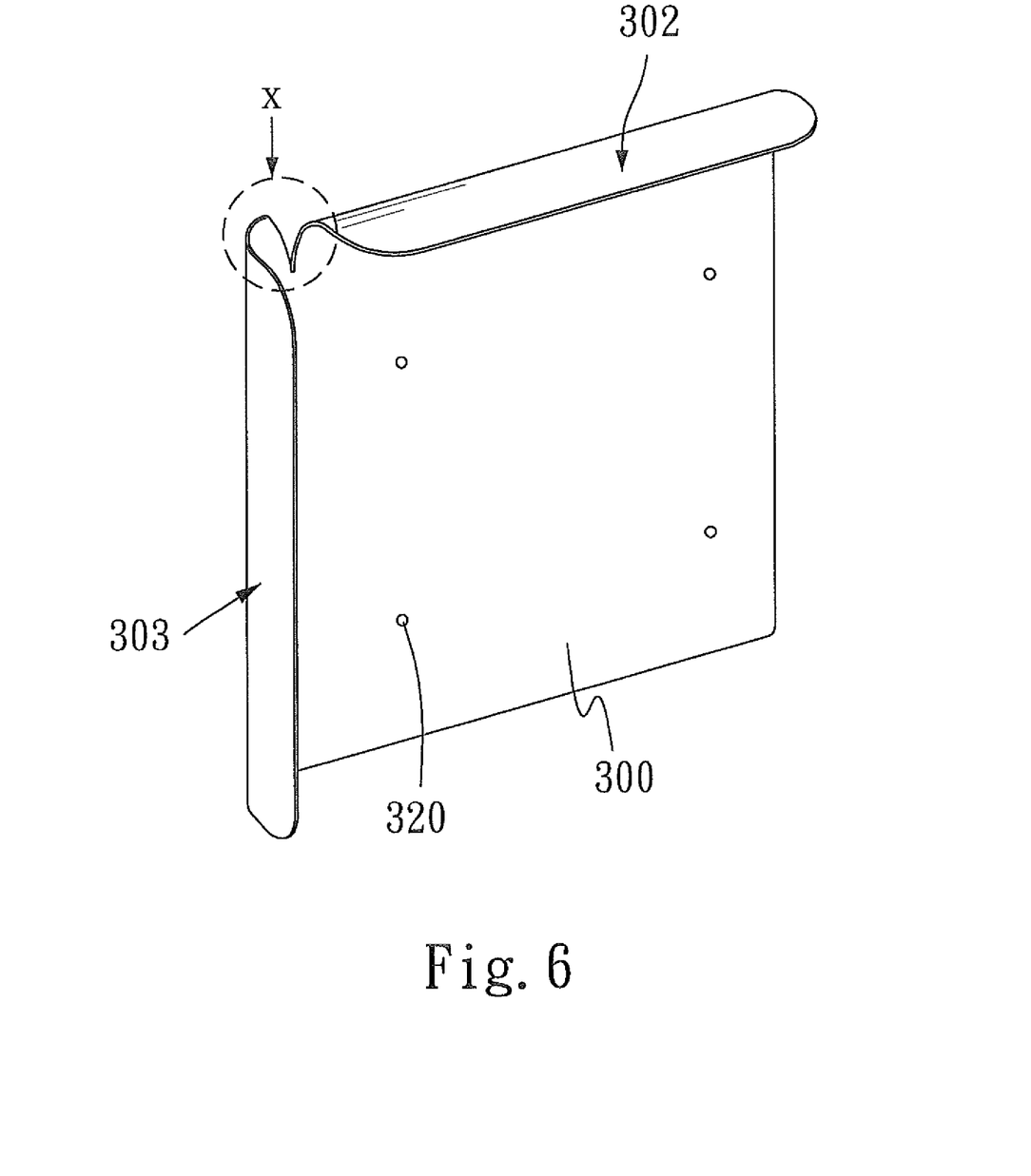
FIG. 6 is an inner side view of a protective device in another embodiment according to the present invention.

Referring to FIG. 6, there is shown an inner side view of a protective device in another embodiment according to the present invention. As shown in the drawing, both the first shielding plate 302 and the second shielding plate 303 bend and extend toward the same surface of the body 300 such that an open receiving space for receiving the casing 20 is formed inside the body 300 (see FIG. 4).

Figure 7:
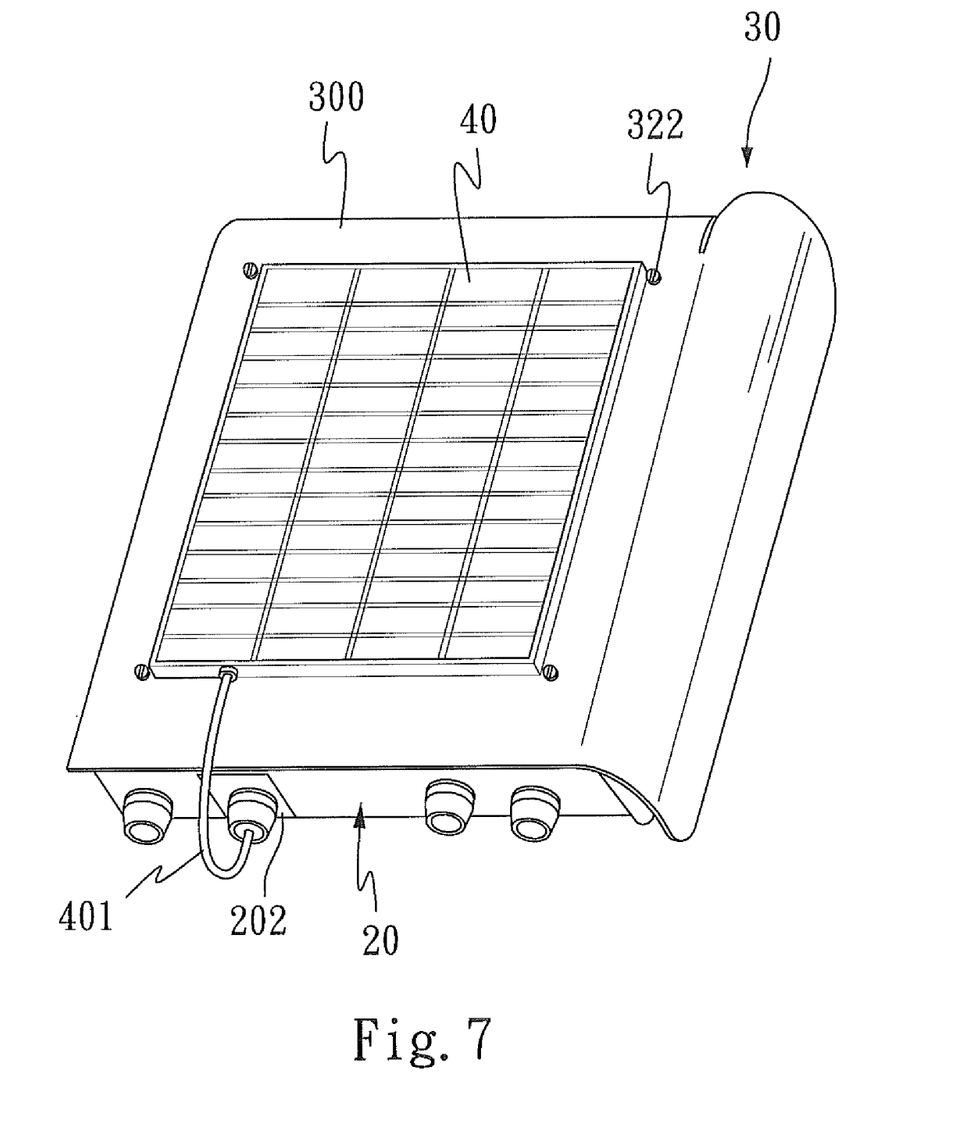
FIG. 7 is a schematic view of the assembly of a protective device coupled to a solar panel in an embodiment according to the present invention.

Referring to FIG. 7 is a schematic view of the assembly of a protective device coupled to a solar panel in an embodiment according to the present invention. To make good use of light energy, the present invention further provides a solar panel 40 externally on the outer surface of the body 300 of the protective device 30. The solar panel 40 generates electric power after irradiated by an external light source and stores the electric power in a power storage unit 202 provided in the casing 20. The power storage unit 202 supplies electric power to the outdoor communication apparatus. For instance, the power storage unit 202 operating in conjunction with a sufficiently strong external light source can supply all the electric power required for operation of the outdoor communication apparatus, and, in most situations, the power storage unit 202 at least reduces the power need of the outdoor communication apparatus in the presence of an external power source.

The position of the solar panel 40 shown in FIG. 7 serves an illustrative purpose. Persons skilled in the art understand that the solar panel 40 can also work in conjunction with the second coupling portions 320 of the protective device (see FIG. 3A) to allow the solar panel 40 and the protective device 30 to be directly fastened with the casing 20 by a fastening element 322.

Figure 8:
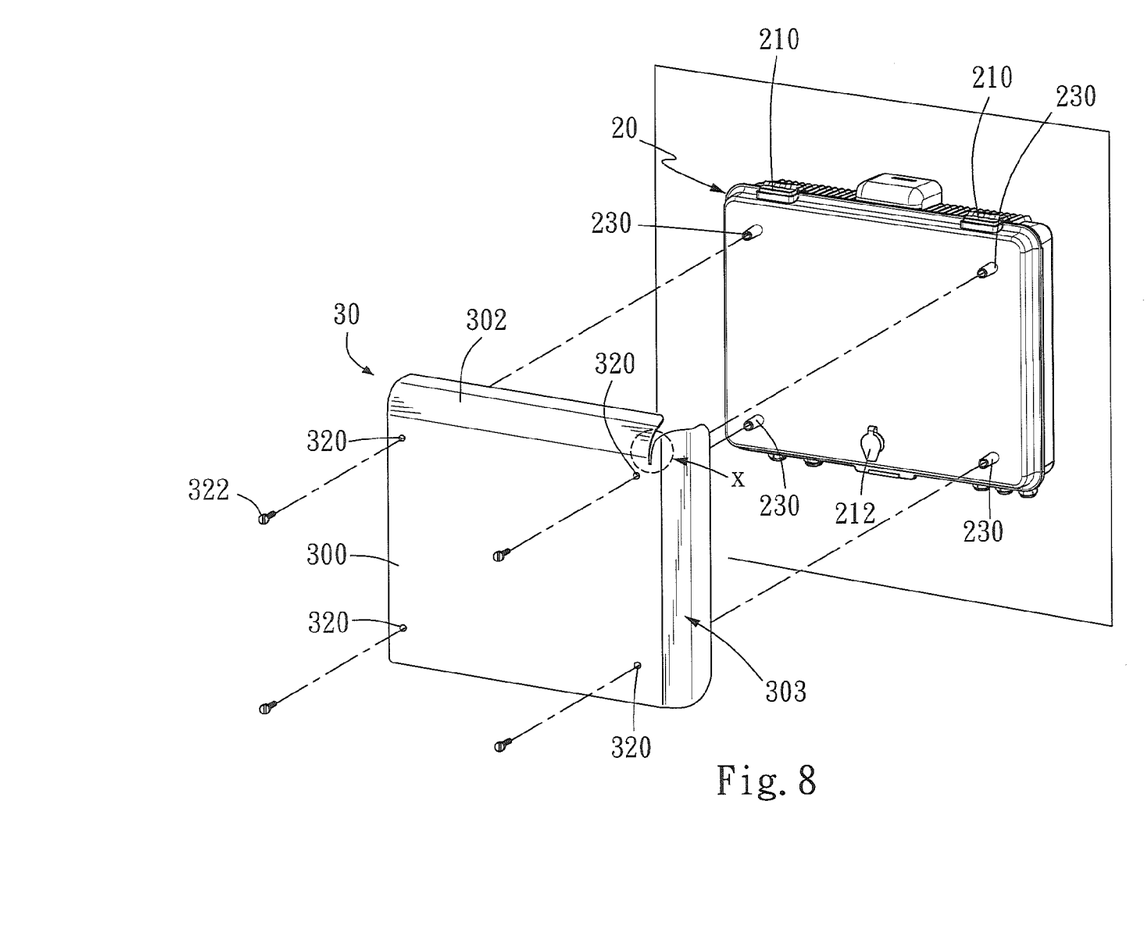
FIG. 8 is a schematic view of a protective device and a casing separated therefrom configured for use with an outdoor communication apparatus and provided with a different first coupling portion in another embodiment according to the present invention.

FIG. 8 shows a schematic view of a protective device and a casing separated therefrom configured for use with an outdoor communication apparatus and provided with different first coupling portions in another embodiment according to the present invention. To further widen the gap between the protective device 30 and the casing 20, the first coupling portions 220 (see FIG. 3A) can be replaced by taper post-shaped tapered first coupling portions 230. The height of the tapered first coupling portions 230 is subject to changes as needed. In another embodiment, the tapered first coupling portions 230 and the casing 20 are integrally formed as a unitary structure.

Figure 9:
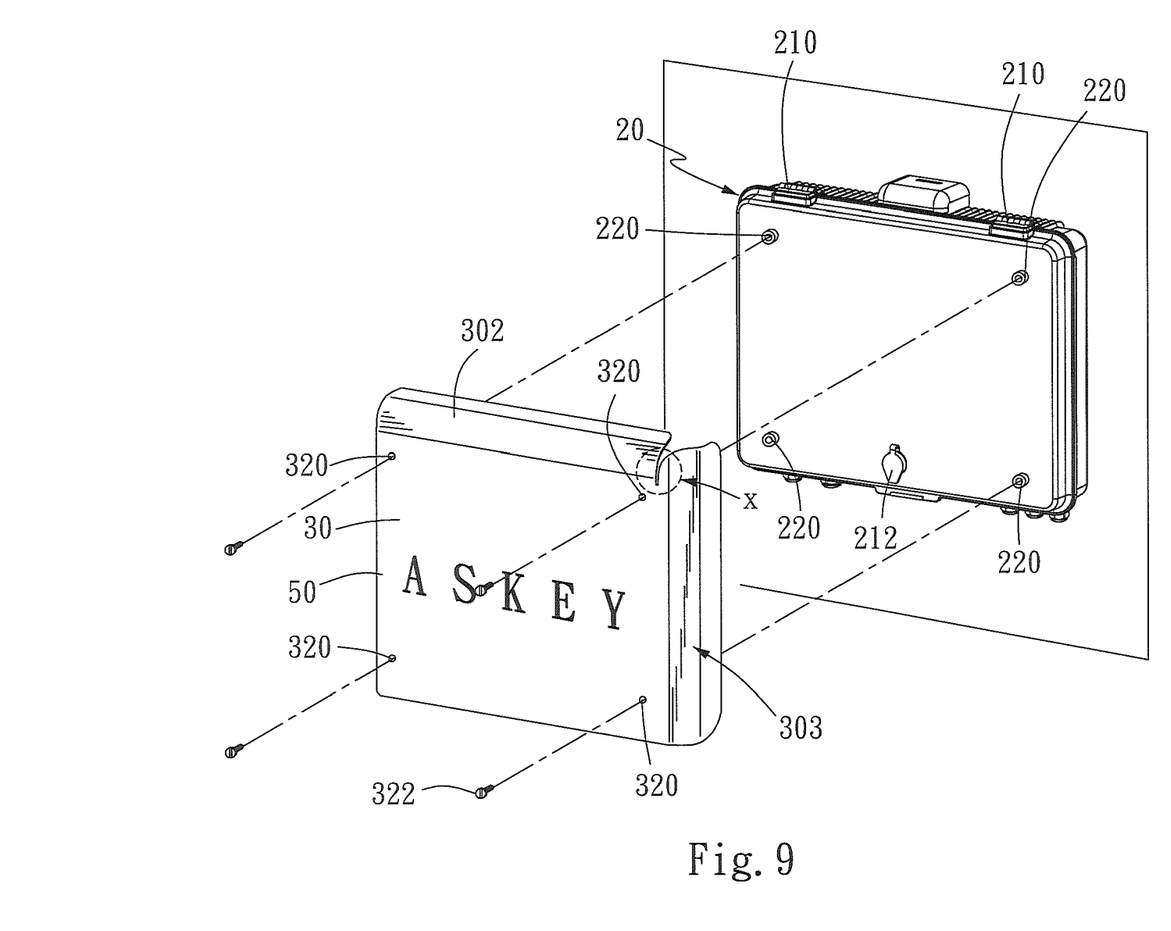
FIG. 9 is a schematic view of a protective device with a mark structure and a casing separated therefrom for an outdoor communication apparatus in another embodiment according to the present invention.

FIG. 9 shows a schematic view of a protective device with a mark structure coupled thereto and a casing separated therefrom for an outdoor communication apparatus in another embodiment according to the present invention. The outer surface of the body 300 is provided with a mark structure 50 for identification, alert, or advertising purposes. The mark structure 50 is a sticker affixed to the body 300 or a mark directly imprinted on the body 300 by printing or by any means of attachment. Alternatively, the mark structure 50 is a laser-engraved pattern, a print or the like and is fixed to the outer surface of the body 300.

Figure 10:
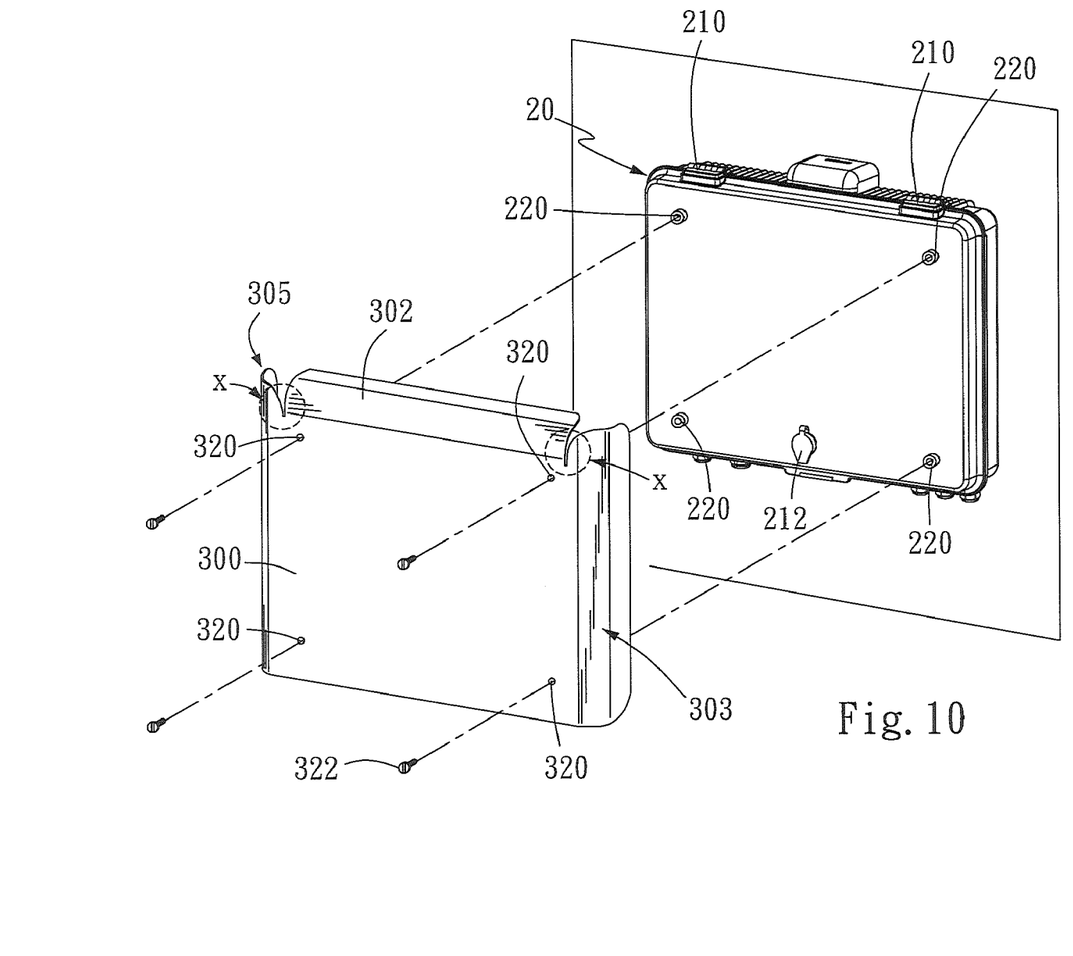
FIG. 10 is aschematic view of a protective device and a casing separated therefrom for use with an outdoor communication apparatus in yet another embodiment according to the present invention.

FIG. 10 shows a schematic view of a protective device and a casing separated therefrom for use with an outdoor communication apparatus in yet another embodiment according to the present invention. In this embodiment, the shielding portion 301 (see FIG. 2) comprises the first shielding plate 302, the second shielding plate 303, and a third shielding plate 305. The protective device 30 in this embodiment has one more shielding plate than the protective device 30 in the preceding embodiments, so as to provide better protection to the casing 20 for an outdoor communication apparatus. As shown in FIG. 10, the third shielding plate 305 and the second shielding plate 303 are on opposite sides of the body 300 and bend and extend toward the inner side surface of the body 300, that is, toward the casing 20 for an outdoor communication apparatus. This embodiment is the same as the preceding embodiments in terms of the remaining variations and additional elements, so the description thereof is omitted herein for brevity.

In conclusion, the present invention provides a protective device effective in preventing the exposure of a casing to direct sunshine, and a shielding portion conducive to enhancement of protection, so as for a communication apparatus in the casing to operate with reliability and stability. The present invention further provides a solar panel externally provided on the protective device to reduce the dependency of an outdoor communication apparatus on an external power source; furthermore, the outdoor communication apparatus can even dispense with the external power source when the solar panel renders the outdoor communication apparatus electrically self-contained.

The present invention is disclosed in the preferred embodiments described above. However, persons skilled in the art understand that the embodiments are provided to illustrate the present invention and should not be interpreted as being restrictive of the scope of the present invention. All equivalent modifications and variations can be made to the embodiments and still fall within the scope of the invention as set forth in the appended claims. Hence, the scope of protection for the present invention should be defined by the appended claims.

What is claimed is:

1. A protective device applicable to a casing provided thereon with a first coupling portion and configured for use with an outdoor communication apparatus, the protective device comprising:
    a body configured to shield a front of the casing, wherein a second coupling portion is provided on the body and coupled to the first coupling portion;
    a shielding portion laterally provided to a side of the body and configured to shield the casing sideways, the shielding portion including a first shielding plate extending from a top of the body and bending and extending toward an inside of the body, and a second shielding plate extending from a side of the body and bending and extending toward the inside of the body; and a solar panel coupled to an outer surface of the body.

2. The protective device of claim 1, wherein the body and the shielding portion are integrally formed as a unitary structure and made of aluminum or aluminum alloy.

3. The protective device of claim 1, wherein a mark structure is provided on an outer surface of the body.

4. The protective device of claim 3, wherein the mark structure is one of a sticker, a laser-engraved pattern, and a print.

5. The protective device of claim 1, wherein the shielding portion further comprises a third shielding plate extending from a side of the body opposite to the second shielding plate and bending and extending toward the inside of the body.

6. The protective device of claim 5, wherein a portion of the second shielding plate and a portion of the third shielding plate extend to two sides of the first shielding plate, respectively.

7. The protective device of claim 1, wherein the first coupling portion comprises a plurality of posts provided on a surface of the casing, wherein each post is provided with a screw hole, and the second coupling portion comprises apertures corresponding in quantity and position to the posts, wherein each post and each aperture are penetrated by the screw for engagement.

8. The protective device of claim 1, wherein the second coupling portion comprises a plurality of posts provided on an inner surface of the body, wherein each post is provided with a screw hole, and the first coupling portion comprises apertures corresponding in quantity and position to the posts, wherein each post and each aperture are penetrated by the screw for engagement.

9. The protective device of claim 1, wherein the first coupling portion comprises a plurality of posts provided on a surface of the casing, wherein each post is provided with a tenon, and the second coupling portion comprises mortises corresponding in quantity and position to the posts, wherein each post and mortise are inserted by each tenon for engagement.

10. The protective device of claim 1, wherein the second coupling portion comprises a plurality of posts provided on an inner surface of the body, wherein each post is provided with a tenon, and the first coupling portion comprises mortises corresponding in quantity and position to the posts, wherein each post and mortise are inserted by the tenon for engagement.

11. A casing for an outdoor communication apparatus, comprising:
a case;
a cover hingedly coupled to the case and provided thereon with a first coupling portion;
a protective device comprising a body for shielding a front of the cover and a shielding portion laterally provided to a side of the body and configured to shield the cover and the case sideways, a second coupling portion provided on the body and coupled to the first coupling portion, wherein the shielding portion comprises a first shielding plate extending from a top of the body and bending and extending toward an inside of the body and a second shielding plate extending from a side of the body and bending and extending toward the inside of the body; and a solar panel coupled to an outer surface of the body.

12. The casing of claim 11, wherein the body and the shielding portion are integrally formed as a unitary structure and made of aluminum or aluminum alloy.

13. The casing of claim 11, wherein a mark structure is provided on an outer surface of the body.

14. The casing of claim 13, wherein the mark structure is one of a sticker, a laser-engraved pattern, and a print.

15. The casing of claim 11, wherein the shielding portion further comprises a third shielding plate extending from a side of the body opposite to the second shielding plate and bending and extending toward the inside of the body.

16. The casing of claim 15, wherein a portion of the second shielding plate and a portion of the third shielding plate extend to two sides of the first shielding plate, respectively.

17. The casing of claim 11, wherein the first coupling portion comprises a plurality of posts provided on a surface of the cover, wherein each post is provided with a screw hole, and the second coupling portion comprises apertures corresponding in quantity and position to the posts, wherein each post and aperture are penetrated by the screw for engagement.

18. The casing of claim 11, wherein the second coupling portion comprises a plurality of posts provided on an inner surface of the body, wherein each post is provided with a screw hole, and the first coupling portion comprises apertures corresponding in quantity and position to the posts, wherein each post and aperture are penetrated by the screw for engagement.

19. The casing of claim 11, wherein the first coupling portion comprises a plurality of posts provided on a surface of the cover, wherein each post is provided with a tenon, and the second coupling portion comprises mortises corresponding in quantity and position to the posts, wherein each post and mortise are inserted by the tenon for engagement.

20. The casing of claim 11, wherein the second coupling portion comprises a plurality of posts provided on an inner surface of the body, wherein each post is provided with a tenon, and the first coupling portion comprises mortises corresponding in quantity and position to the posts, wherein each post and mortise are inserted by the tenon for engagement.

* * * * *